United States Patent
Azuma et al.

(10) Patent No.: US 6,661,038 B2
(45) Date of Patent: Dec. 9, 2003

(54) SEMICONDUCTOR DEVICE AND METHOD OF PRODUCING THE SAME

(75) Inventors: Kouji Azuma, Tokyo (JP); Yousuke Miyoshi, Tokyo (JP); Fumio Harima, Tokyo (JP); Masahiro Tanomura, Tokyo (JP); Hidenori Shimawaki, Tokyo (JP)

(73) Assignee: NEC Compound Semiconductor Devices, Ltd., Kawasaki (JP)

( * ) Notice: Subject to any disclaimer, the term of this patent is extended or adjusted under 35 U.S.C. 154(b) by 0 days.

(21) Appl. No.: 10/084,233

(22) Filed: Feb. 28, 2002

(65) Prior Publication Data

US 2002/0121675 A1 Sep. 5, 2002

(30) Foreign Application Priority Data

Mar. 1, 2001 (JP) ........................................ 2001-057408

(51) Int. Cl.⁷ ................... H01L 31/072; H01L 31/109; H01L 31/0328; H01L 31/0336; H01L 27/082
(52) U.S. Cl. ....................... 257/200; 257/183; 257/197; 257/198; 257/565
(58) Field of Search ................................ 257/183, 197, 257/198, 200, 565–575

(56) References Cited

U.S. PATENT DOCUMENTS 5,631,477 A * 5/1997 Streit et al. ................. 257/197
5,798,535 A * 8/1998 Huang et al. ................. 257/83
5,952,672 A * 9/1999 Kikkawa ....................... 257/15
6,426,266 B1 * 7/2002 Tanaka ......................... 438/315
6,462,362 B1 * 10/2002 Miyoshi ...................... 257/198
2001/0009279 A1 * 7/2001 Kikkawa ....................... 257/24
2002/0153536 A1 * 10/2002 Hirata et al. ................. 257/197

FOREIGN PATENT DOCUMENTS

| JP | 7-245316 | 9/1995 |
| JP | 11-238739 | 8/1999 |
| JP | 2000-156382 | 6/2000 |

* cited by examiner

Primary Examiner—Eddie Lee
Assistant Examiner—Jesse Fenty
(74) Attorney, Agent, or Firm—McGinn & Gibb, PLLC

(57) ABSTRACT

A semiconductor device of the present invention includes a systematic structure layer of first conductivity type and having a systematically arranged structure. The systematic structure layer is formed on a collector contact layer of first conductivity type, which is connected to collector electrodes. A compensation layer of first conductivity type is formed on the systematic structure layer. A collector layer of first conductivity type is formed on the compensation layer. A base layer is formed on the collector layer and connected to base electrodes. An emitter layer is formed on the base electrode and connected to an emitter electrode. The semiconductor device reduces collector resistance and thereby improves reliability.

33 Claims, 13 Drawing Sheets

SEMICONDUCTOR DEVICE AND METHOD OF PRODUCING THE SAME

BACKGROUND OF THE INVENTION

1. Field of the Invention

The present invention relates to a semiconductor device and a method of producing the same and more particularly to a semiconductor device capable of reducing collector resistance and a method of producing the same.

2. Description of the Background Art

A bipolar transistor is operable with a single power supply and has a higher current driving ability than a field effect transistor. Particularly, a bipolar transistor implemented by compound semiconductors has various advantages over the other bipolar transistors. For example, such a bipolar transistor can have an emitter and a base connected by heterojunction. Also, the bipolar transistor enhances emitter injection efficiency even if the concentration of the base is increased. Further, in the bipolar transistor that is a vertical device, the running characteristic of carrier is determined mainly by the structure of a crystal layer, so that a desirable high frequency characteristic is achievable without resorting to fine lithographic technologies.

Japanese Patent Laid-Open Publication No. 11-238739, for example, discloses a heterojunction bipolar transistor configured to reduce irregularity in base-mesa step for thereby enhancing yield, and a method of producing the same.

Japanese Patent Laid-Open Publication No. 2000-156382 teaches a semiconductor device (bipolar transistor) configured to reduce capacitance between a base and a collector for thereby improving a high frequency characteristic, and a method of producing the same. The semiconductor device taught in this document includes a subcollector layer and collector electrodes formed thereon. A laminate collector layer is formed on the subcollector layer and includes a single GaAs layer. A base layer is formed on the collector layer while base electrodes are formed on the base layer. An emitter electrode is formed on an emitter layer. The GaAs layer beneath the base electrode is removed in order to form a low dielectric constant film.

Further, Japanese Patent Laid-Open Publication No. 7-245316 proposes a heterojunction bipolar transistor constructed to promote high speed, low power consumption operation and improve device characteristics, and a method of producing the same. For this purpose, according to the above document, an intrinsic base layer is thinned with high controllability to thereby reduce the sheet resistance and contact resistance of an external base layer. More specifically, the heterojunction bipolar transistor includes a collector layer, an intrinsic base layer formed on the collector layer, an external base layer formed on the collector layer around the intrinsic base layer via an etching stopper layer, and an emitter layer formed on the intrinsic base layer and greater in band gap than the latter.

However, the conventional structures described above have some problems left unsolved.

SUMMARY OF THE INVENTION

It is an object of the present invention to provide a semiconductor device capable of reducing collector resistance to thereby enhance reliable operation, and a method of producing the same.

It is another object of the present invention to provide a semiconductor device free from strict limitations on the carrier concentration and thickness of an InGaP layer, and a method of producing the same.

It is still another object of the present invention to provide a semiconductor device capable of suppressing an energy barrier to thereby promote smooth electron transport, and a method of producing the same.

It is a further object of the present invention to provide a semiconductor device producible by a simpler process than the conventional semiconductor devices, and a method of producing the same.

A semiconductor device of the present invention includes a systematic structure layer of first conductivity type and having a systematically arranged structure. The systematic structure layer is formed on a collector contact layer of first conductivity type, which is connected to collector electrodes. A compensation layer of first conductivity type is formed on the systematic structure layer. A collector layer of first conductivity type is formed on the compensation layer. A base layer is formed on the collector layer and connected to base electrodes. An emitter layer is formed on the base electrode and connected to an emitter electrode.

A method of producing the above semiconductor device is also disclosed.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
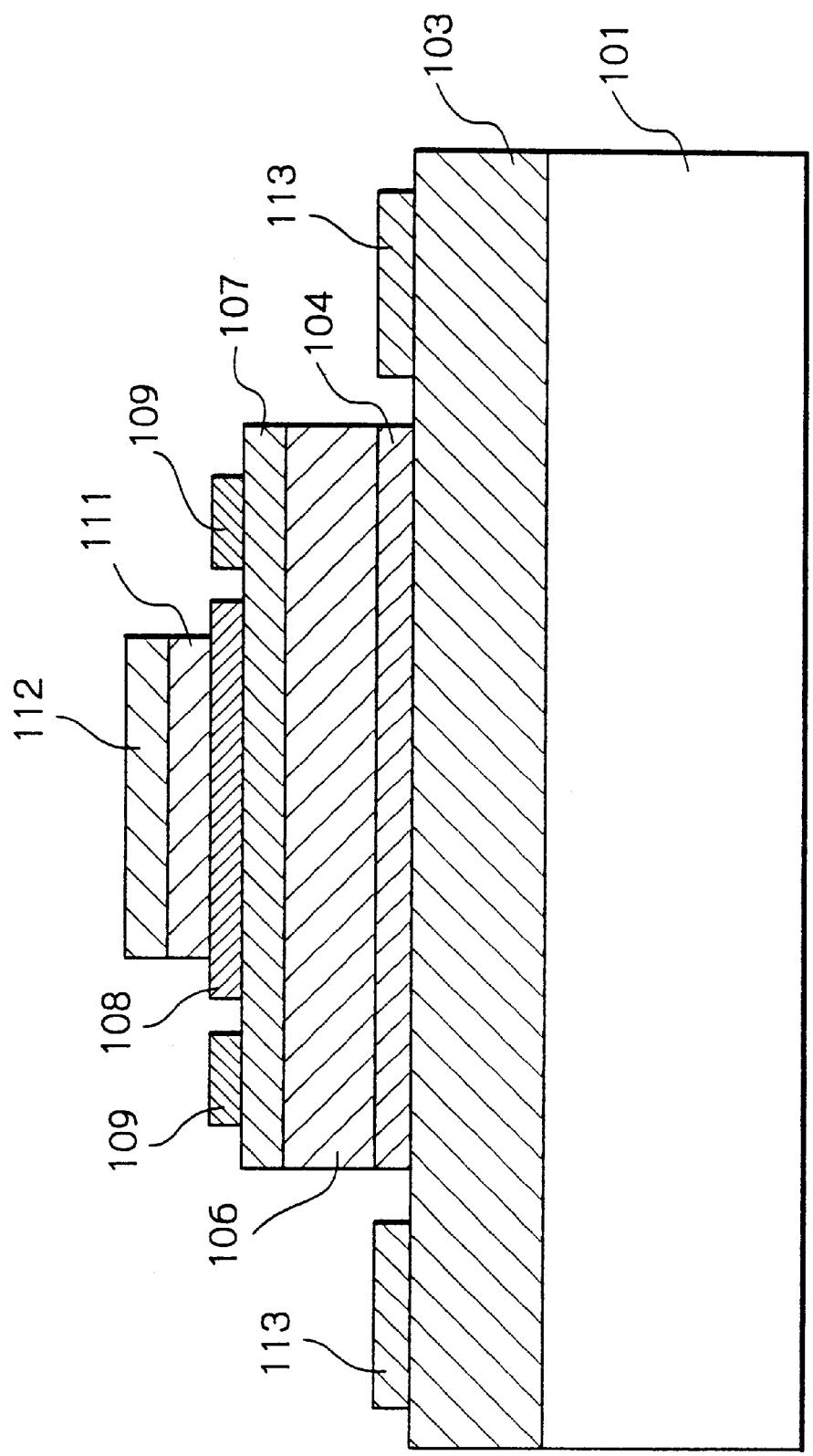
FIG. 1 is a section showing a conventional semiconductor device.

To better understand the present invention, brief reference will be made to a conventional semiconductor device implemented as a heterojunction bipolar transistor, shown in FIG. 1. The semiconductor device to be described is taught in Laid-Open Publication No. 11-238739 mentioned earlier. As shown, the semiconductor device includes a semi-insulant GaAs substrate 101 on which an n+ type GaAs layer 103 is formed. An n type InGaP layer 104 is formed on the n+ type GaAs layer 103. An n type GaAs layer 106 is formed on the n type InGaP layer 104. A p+ type GaAs layer 107 is formed on the n type GaAs layer 106. An n type InGaP layer 108 is formed on the p+ type GaAs layer 107. Further, an n+ type GaAs layer 111 is formed on the n type InGaP layer 108.

The n+ type GaAs, layer 103 constitutes a collector contact layer while the n type GaAs layer 106 constitutes a collector layer. The p+ type GaAs layer 107 forms a base layer while the n type InGaP layer 108 forms an emitter layer. Further, the n+ type GaAs layer 111 forms an emitter cap layer.

An emitter electrode 112 is formed on the n+ type GaAs layer or emitter cap layer 111, constituting an ohmic electrode. Collector electrodes 113 are formed on the n+ type GaAs layer or collector contact layer 103 in pairs.

The heterojunction bipolar transistor with the above configuration has a minimum of base-mesa irregularity and therefore enhances yield, as stated earlier.

Figure 2:
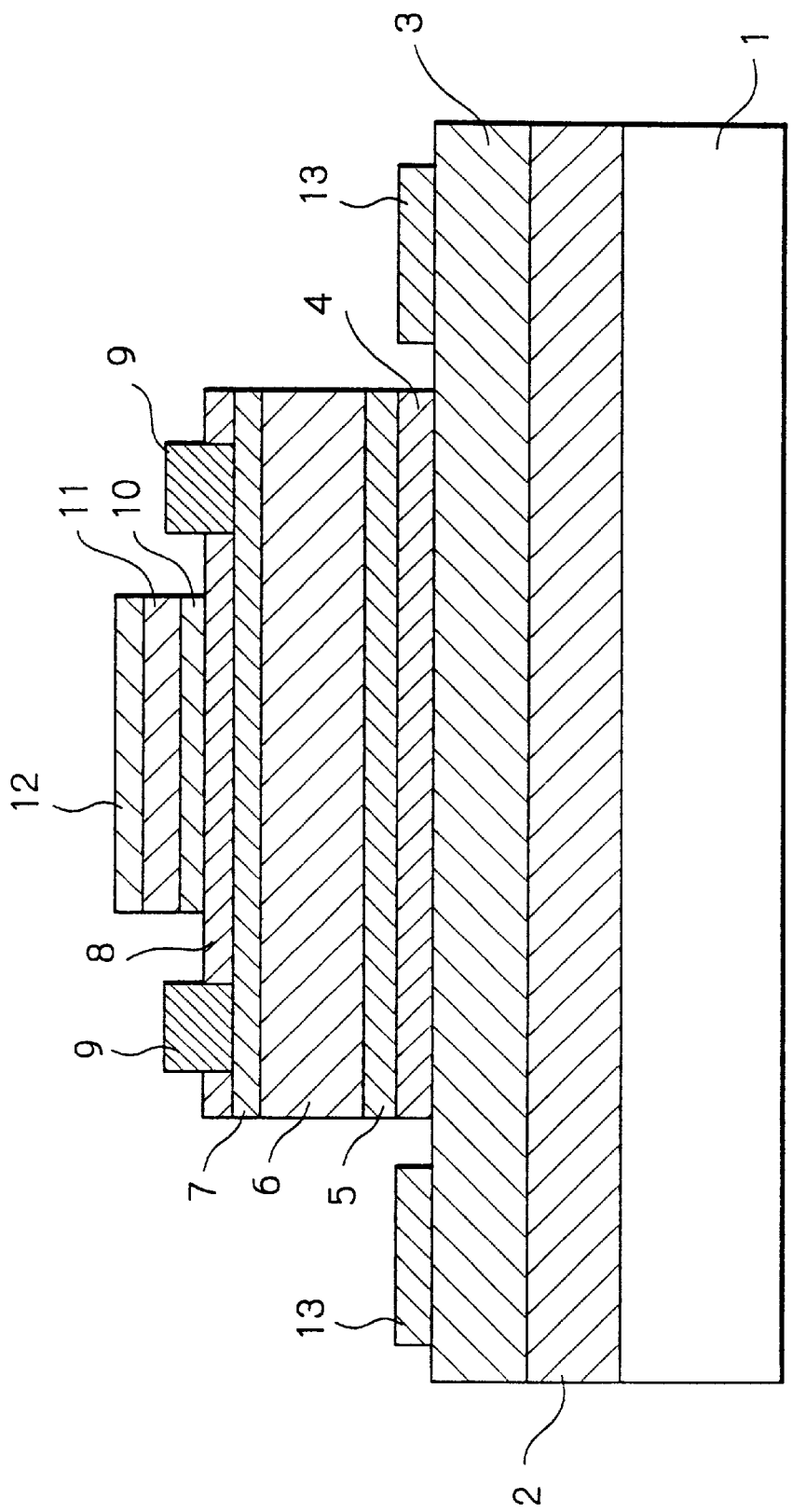
FIG. 2 is a section showing a semiconductor device embodying the present invention.

Referring to FIG. 2, a semiconductor device embodying the present invention will be described. As shown, the semiconductor device includes a semi-insulant GaAs substrate 1. A buffer layer 2 is formed on the substrate 1 for maintaining crystalline characteristics stable. To implement ohmic contact of a collector, an n+ type GaAs layer 3 is formed on the buffer layer 2 and has a carrier concentration of $3 \times 10^{18}$ cm$^{-3}$ or above. An n type InGaP layer 4 is formed on the n+ type GaAs layer 3 and has a systematic structure in which In and Ga are systematically arranged in a type III atomic layer plane. Assume that the n type InGaP layer 4 is represented by In$_x$Ga$_{1-x}$P. Then, x is selected to be greater than or equal to 0.47, but smaller than or equal to 0.52, so that the band gap is between 1.83 eV and 1.88 eV.

An n+ type GaAs layer 5 is formed on the n type InGaP layer 4. The GaAs layer 5 has a carrier concentration as high as $3 \times 10^{18}$ cm$^{-3}$ or above and a thickness of 10 nm or less, compensating for the exhaustion of the carrier of the InGaP layer 4. A nondoped GaAs layer 6 is formed on the N+ GaAs layer 5. A p+ type GaAs layer 7 is formed on the nondoped GaAs layer 6. An n type InGaP layer 8 is formed on the p+ type GaAs layer 7. An n type GaAs layer 10 is formed on the n type InGaP layer 8. Further, an n+ type InGaAs layer 11 is formed on the n type GaAs layer 10.

The n+ GaAs layer 3 and nondoped GaAs layer 6 constitute a collector contact layer and a collector layer, respectively. The p+ type GaAs layer 7 and n type InGaP layer 8 constitute a base layer and an emitter layer, respectively. The n type GaAs layer 10 and n+ type InGaAs layer 11 constitute an emitter contact layer and an emitter cap layer, respectively. For the collector layer, use may be made of an n type GaAs layer in place of the nondoped GaAs layer 6.

An n+ InGaAs layer 11 is formed on the n+ InGaAs layer or emitter cap layer 11, constituting an ohmic electrode. Collector electrodes 13 are formed on the n+ GaAs layer or collector contact layer 3 in pairs. Base electrodes 9 are formed on the exposed portions of the n type InGaP layer or emitter layer 8 in pairs. Each two base electrodes 9 forming a pair extend throughout the n type InGaP layer 8 to be electrically connected to the p+ type GaAs layer or base layer 7.

As stated above, in the illustrative embodiment, the n type InGaP layer 4 with the systematic structure is formed on the n+ type GaAs layer or collector contact layer 3, which intervenes between the nondoped GaAs layer or collector layer 6 and the n+ type GaAs layer or collector contact layer 3. The n+ type GaAs layer 5 with the high carrier concentration is formed on the n type InGaP layer 4. This GaAs layer 5 prevents the carrier from being exhausted due to a trap induced at the interface between the n type InGaP layer 4 and nondoped GaAs layer (or n type GaAs layer) 6. The nondoped GaAs layer or collector layer 6 is formed on the n+ type GaAs layer 5. The n type InGaP layer 4 and n+ type GaAs layer 5 cooperate to obviate the trap otherwise occurring at the interface of the InGaP/GaAs heterojunction.

With the above structure, the illustrative embodiment suppresses an energy barrier that obstructs electron transport between the n type InGaP layer 4 and the nondoped GaAs layer (or n type GaAs layer) 6, thereby promoting smooth electron transport. Moreover, the illustrative embodiment reduces collector resistance and thereby enhances reliable operation.

Figure 3:
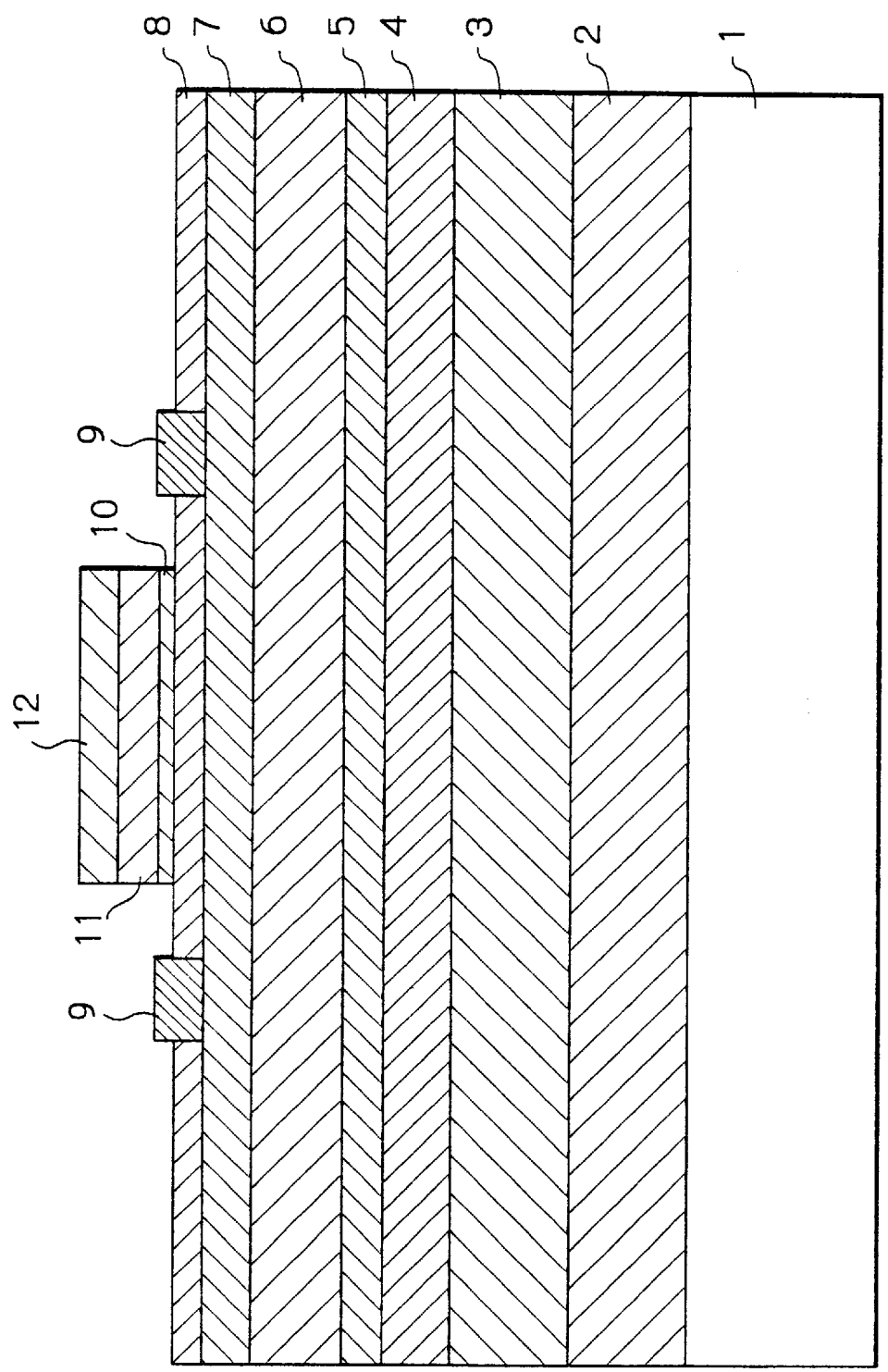
FIGS. 3 through 5 are sections showing a specific procedure for producing the semiconductor device shown in FIG. 2.
Figure 4:
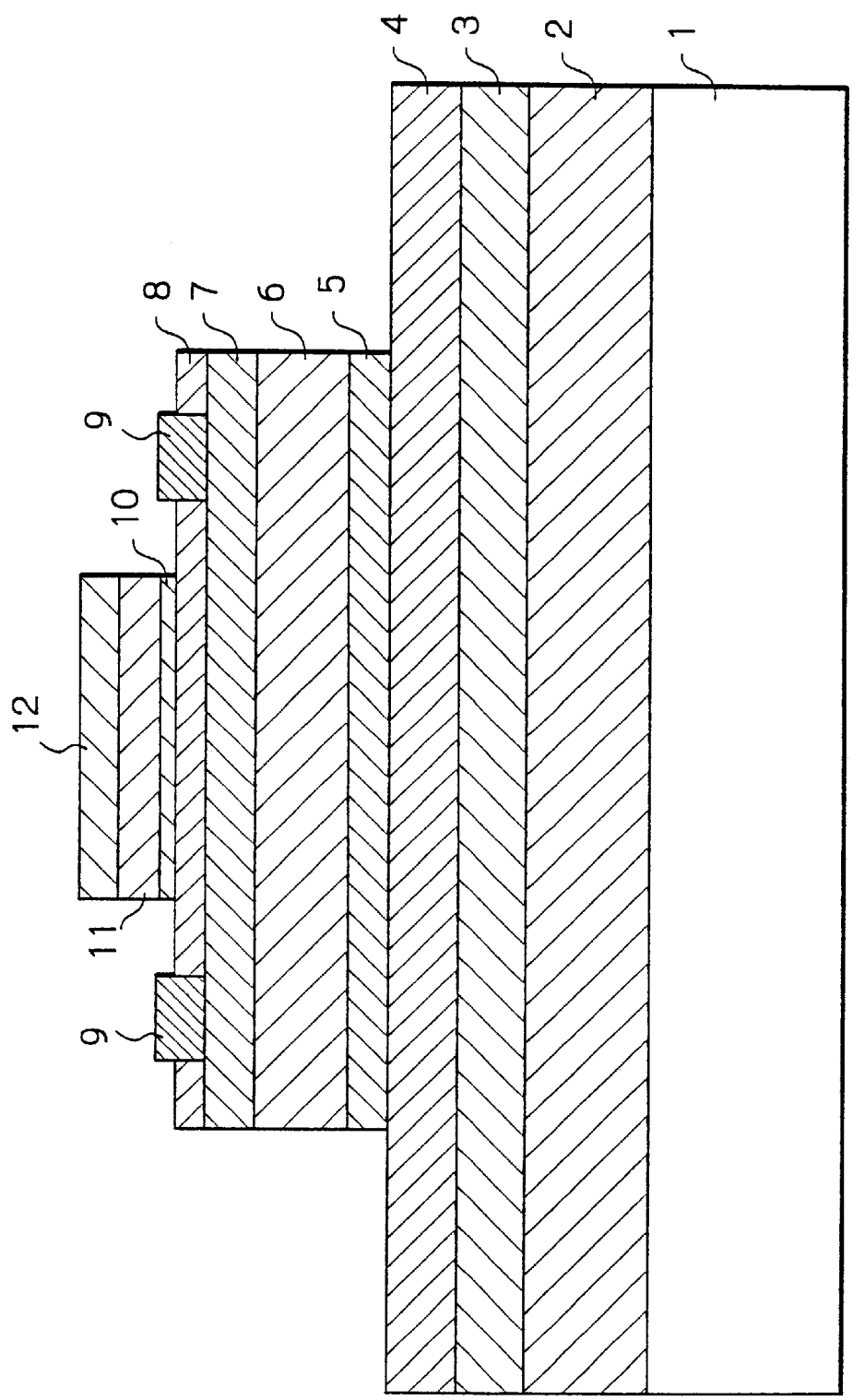
Figure 5:
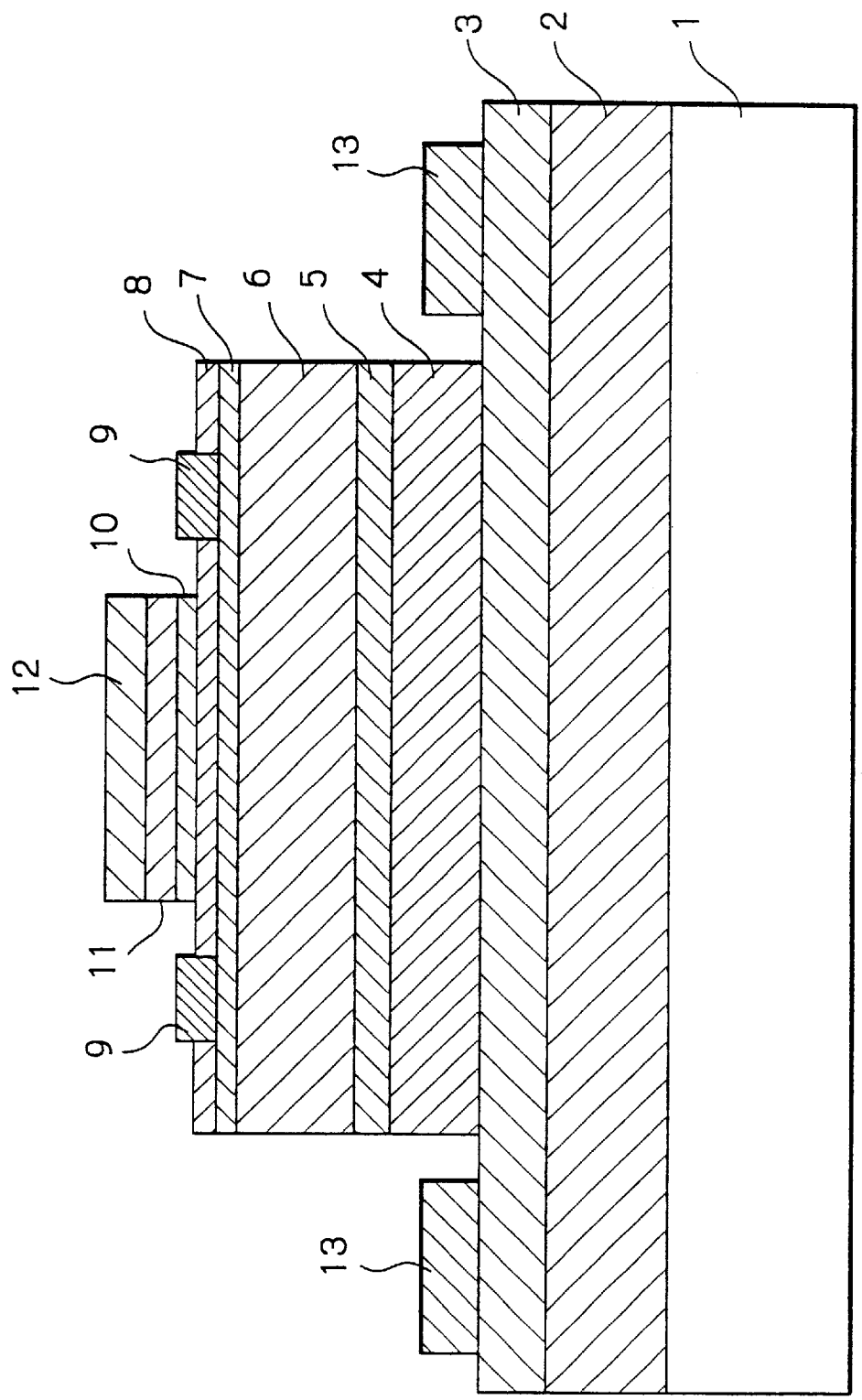

Reference will be made to FIGS. 3 through 5 for describing a specific procedure for producing the semiconductor device shown in FIG. 2. As shown in FIG. 3, the buffer layer 2 is formed on the semi-insulant GaAs substrate 1 for maintaining crystalline characteristics stable. Subsequently, to implement ohmic contact of the collector, the n+ type GaAs layer 3 with the previously mentioned carrier concentration is formed on the buffer layer 2. The n type InGaP layer 4 with the systematic structure is formed on the n+ type GaAs layer 3. In the n type InGaP layer 4, x is selected to be greater than or equal to 0.47, but smaller than or equal to 0.52 in order to implement a band gap between 1.83 eV and 1.88 eV, as stated earlier. The n+ type GaAs layer 5 with the carrier concentration and thickness mentioned earlier is formed on the n type InGaP layer 4 for the purpose of compensating for the exhaustion of the carrier of the InGaP layer 4. The nondoped GaAs layer 6 is formed on the n+ GaAs layer 5. The p+ type GaAs layer 7 is formed on the nondoped GaAs layer 6. The n type InGaP layer 8 is formed on the p+ type GaAs layer 7. The n type GaAs layer 10 is formed on the n type InGaP layer 8. Further, the n+ type InGaAs layer 11 is formed on the n type GaAs layer 10. The laminate crystal line layer described so far is formed by the gaseous phase growth of organic metals.

Subsequently, the emitter electrode 12 is formed on part of the n+ type InGaAs layer or emitter cap layer 11. Part of the n+ type InGaAs layer and part of the n type GaAs layer or emitter contact layer 10 are removed by etching with the emitter electrode 12 serving as a mask. As a result, the n type InGaP layer or emitter layer 8 is partly exposed. For etching, use is made of an etchant implemented as a mixture of phosphoric acid, hydrogen peroxide and water. At this instant, the emitter layer 8 plays the role of an etching stopper. Thereafter, portions of the n type InGaP layer 8 where the base electrodes 9 should be formed are removed by etching using hydrochloric acid or diluted hydrochloric acid as an etchant. Consequently, holes are formed from the surface of the emitter layer 8 to the surface of the base layer 7. Then, the base electrodes 9 are formed in the above holes. Alternatively, the portions of the n type InGaP layer 8 corresponding to the base electrodes 9 may be alloyed at 400° C. in place of being removed by etching, in which case the base electrodes 9 will be formed on the p+ GaAs layer 7.

As shown in FIG. 4, after the formation of the base electrodes 9, part of the n type InGaP layer 8 is etched to the surface of the base layer 7 by use of hydrochloric acid or diluted hydrochloric acid. Subsequently, part of the base layer 7, part of the collector layer 6 and part of the n+ type GaAs layer 5 are etched from the surface of the base layer 7 to the surface of the InGaP layer 4 by a mixture of phosphoric acid, hydrogen peroxide and water. As a result, the InGaP layer 4 is partly exposed to the outside. At this instant, the n type InGaP layer 4 plays the role of an etching stopper.

Subsequently, as shown in FIG. 5, etching is effected from the exposed edges of the InGaP layer 4 to the surface of the n+ GaAs layer or collector contact layer 3 by using hydrochloric acid or diluted hydrochloric acid, thereby exposing part of the n+ type GaAs layer 3. The collector electrodes 13 are formed on the exposed portions of the collector contact layer 3. The collector electrodes 13 are again subjected to 400° C. alloying for implementing ohmic contact.

The procedure described above is characterized by the following. InGaP and other P-based semiconductor substances can be etched by hydrochloric acid or diluted hydrochloric acid, but cannot be etched by a mixture of phosphoric acid, hydrogen peroxide and water. On the other hand, InGaAs, GaAs and other As-based semiconductor substances cannot be etched by hydrochloric acid or diluted hydrochloric acid, but can be etched by the above mixture. The procedure therefore can effect selective etching.

The structure formed by selective etching suppresses the previously mentioned energy barrier and thereby promotes smooth electron transport, thereby reducing collector resistance. For example, assume a heterojunction bipolar transistor having emitter width of 3 $\mu$m and a finger length of 40 $\mu$m. Then, the collector electrodes included in the conventional structure have intrinsic collector resistance as high as about 10 $\Omega$ except for contact resistance. By contrast, the collector electrodes 13 of the illustrative embodiment have intrinsic collector resistance as low as about 8 $\Omega$.

As for a power amplifier with low operation voltage, ON resistance is predominant, particularly when the signal size is great; the lower the ON resistance, the higher the output voltage and efficiency. The illustrative embodiment, which lowers collector resistance, lowers ON resistance as well for thereby improving characteristics. For example, assuming a frequency of 900 MHz, a collector voltage of 3.5 V, and an emitter area of 2,880 m$^2$, then the illustrative embodiment improves additional efficiency by 1% to 2% when output voltage is 1 dB in a gain compressed condition.

Further, the n type InGaP layer 4 of the illustrative embodiment is free from strict limitations on carrier concentration and thickness. The illustrative embodiment therefore reduces irregularity in the characteristics of the interface between the collector layer 6 and the InGaP layer 4 ascribable to irregularity in crystal growth. Moreover, the illustrative embodiment is practicable with a simpler procedure than the conventional semiconductor device.

Figure 6:
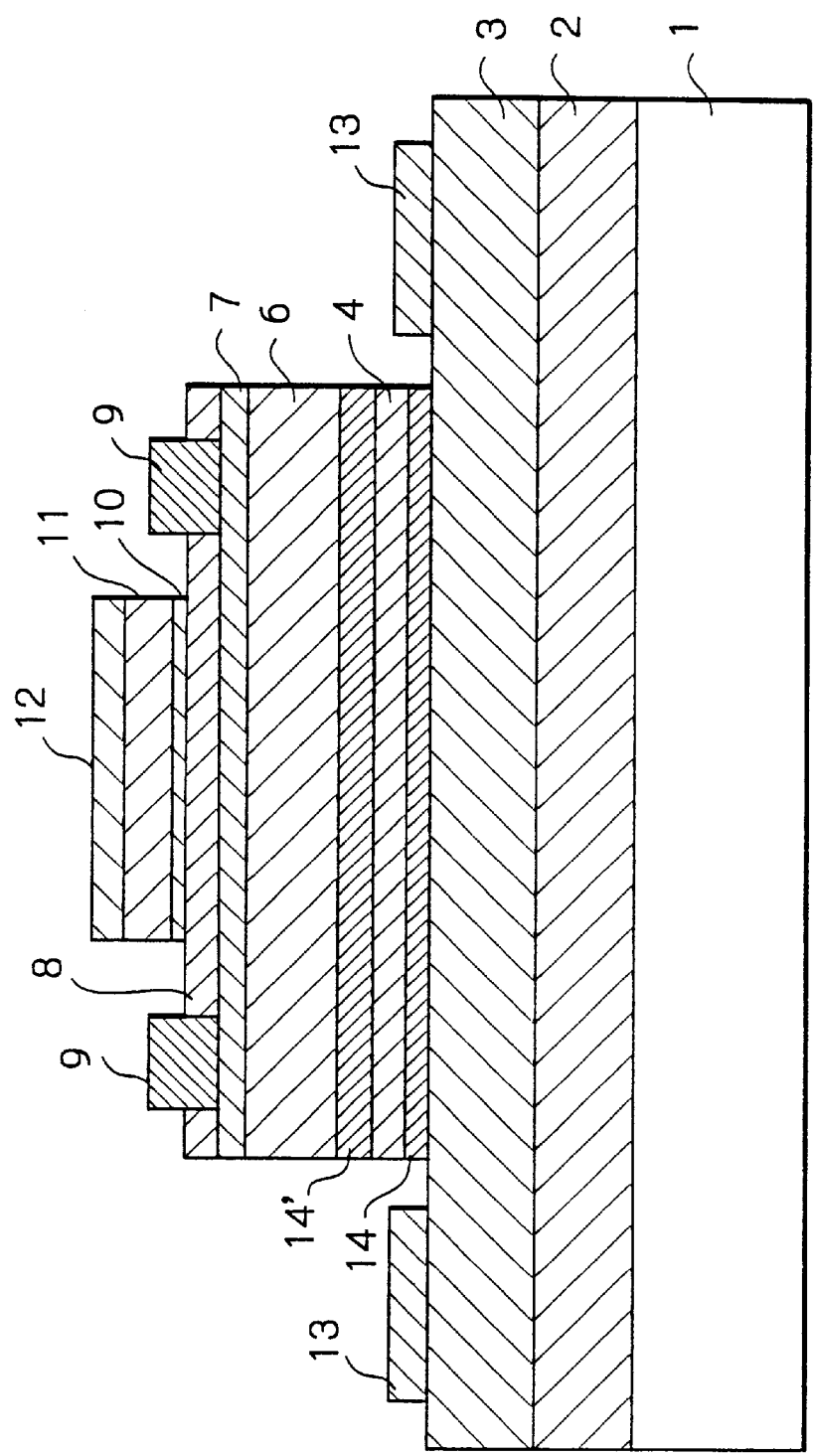
FIG. 6 is a section showing an alternative embodiment of the present invention.

An alternative embodiment of the present invention will be described with reference to FIG. 6. The alternative embodiment is essentially similar to the previous embodiment except for the following. As shown, an n+ type InGaP layer 14 with a carrier concentration as high as 2×10$^{18}$ cm$^{-3}$ or above is formed on the n+ GaAs layer 3. The n type InGaP layer 4 with the previously stated systematic In and Ga structure is formed on the n+ type InGaP layer 14. Again, x of In$_x$Ga$_{1-x}$P representative of the n type InGaP layer 4 lies in the range of $0.47 \leq x \leq 0.52$, implementing the band gap of 1.8 eV to 1.88 eV.

An n+ type InGaP layer 14' with a carrier concentration as high as 2×10$^{18}$ cm$^{-3}$ or above is formed on the n type InGaP layer 4. The n+ type InGaP layers 14 and 14' cooperate to compensate for the exhaustion of the carrier of the n type InGaP layer 4. The nondoped GaAs layer 6 is formed on the n+ InGaP layer 14'. As for the rest of the configuration, this embodiment is identical with the previous embodiment.

As stated above, in the illustrative embodiment, the n+ type InGaP layer 14 with the high carrier concentration is formed on the n+ GaAs layer or collector contact layer 3 between the layer 3 and the nondoped GaAs layer or collector layer 6. The n type InGaP layer 4 with the systematic In and Ga structure is formed on the n+ type InGaP layer 14. The n+ type InGaP layer 14' with the high carrier concentration is formed on the n type InGaP layer 4.

Further, the nondoped GaAs layer or collector layer 6 is formed on the n+ type InGaP layer 14'. The n type InGaP layer 4 and n+ type InGaP layers 14 and 14' cooperate to obviate a trap otherwise occurring at the interface of the InGaP/GaAs heterojunction, as in the previous embodiment.

With the above structure, the illustrative embodiment, like the previous embodiment, suppresses the energy barrier that obstructs electron transport between the n type InGaP layer 4 and the nondoped GaAs layer (or n type GaAs layer) 6, thereby promoting smooth electron transport. Moreover, the illustrative embodiment reduces collector resistance and thereby enhances reliable operation.

Figure 7:
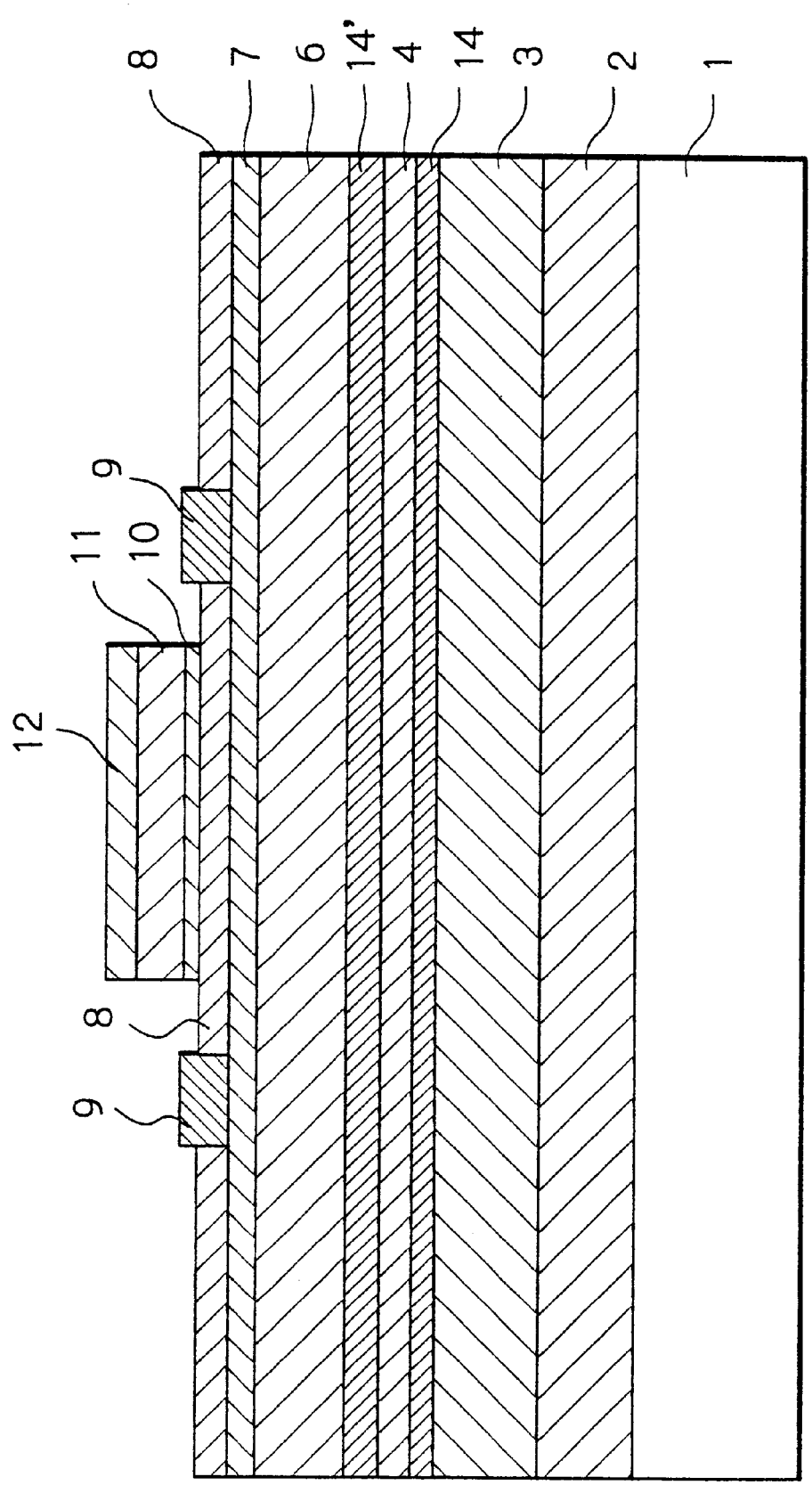
FIGS. 7 through 9 are sections showing a specific procedure for producing the semiconductor device of the alternative embodiment.

A procedure for producing the semiconductor device shown in FIG. 6 will be described hereinafter with reference to FIGS. 7 through 9. The following description will concentrate on differences between the illustrative embodiment and the previous embodiment. As shown in FIG. 7, after the n+ GaAs layer 3 has been formed, the n+ type InGaP layer 14 with the high carrier concentration is formed. Then, the InGaP layer 4 with the systematic In and Ga structure is formed on the n+ type InGaP layer 14. Subsequently, the n+ InGaP layer 14' with the high carrier concentration is formed on the n type InGaP layer 4. Subsequently, the nondoped GaAs layer 6 is formed on the n+ InGaP layer 14'. A sequence of steps to follow up to the formation of the base electrodes 9 are identical with the sequence of the previous embodiment and will not be described specifically in order to avoid redundancy.

Figure 8:
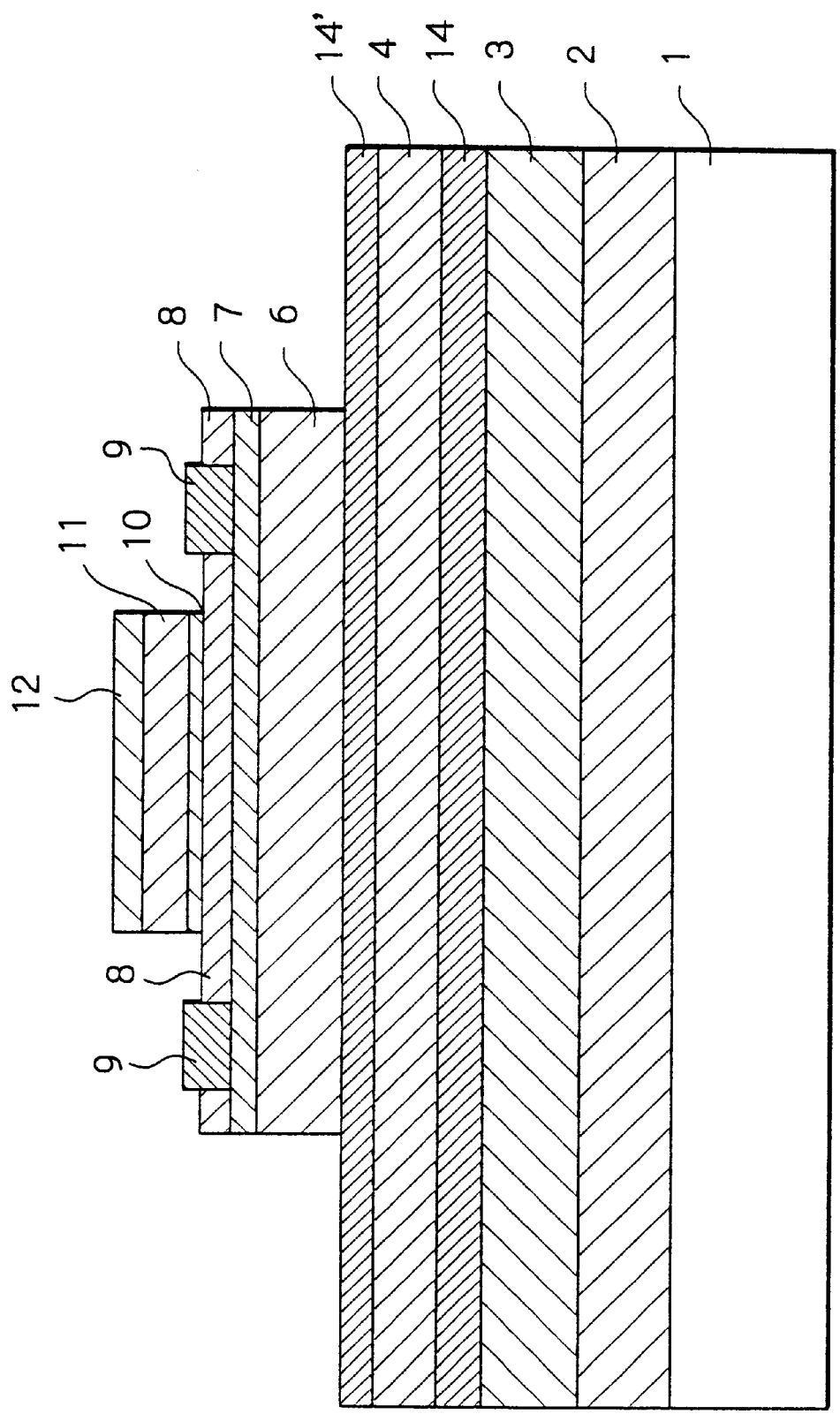

As shown in FIG. 8, after the formation of the base electrodes 9, part of the n type InGaP layer 8 is etched to the surface of the base layer 7 by use of hydrochloric acid or diluted hydrochloric acid. Subsequently, part of the p+ type GaAs layer or base layer 7 and part of the nondoped GaAs layer or collector layer (or n type GaAs layer) 6 are etched from the surface of the base layer 7 to the surface of the n+ type InGaP layer 14' by a mixture of phosphoric acid, hydrogen peroxide and water. As a result, the n+ type InGaP layer 14' is partly exposed to the outside. At this instant, the n+ type InGaP layer 14' plays the role of an etching stopper.

Figure 9:
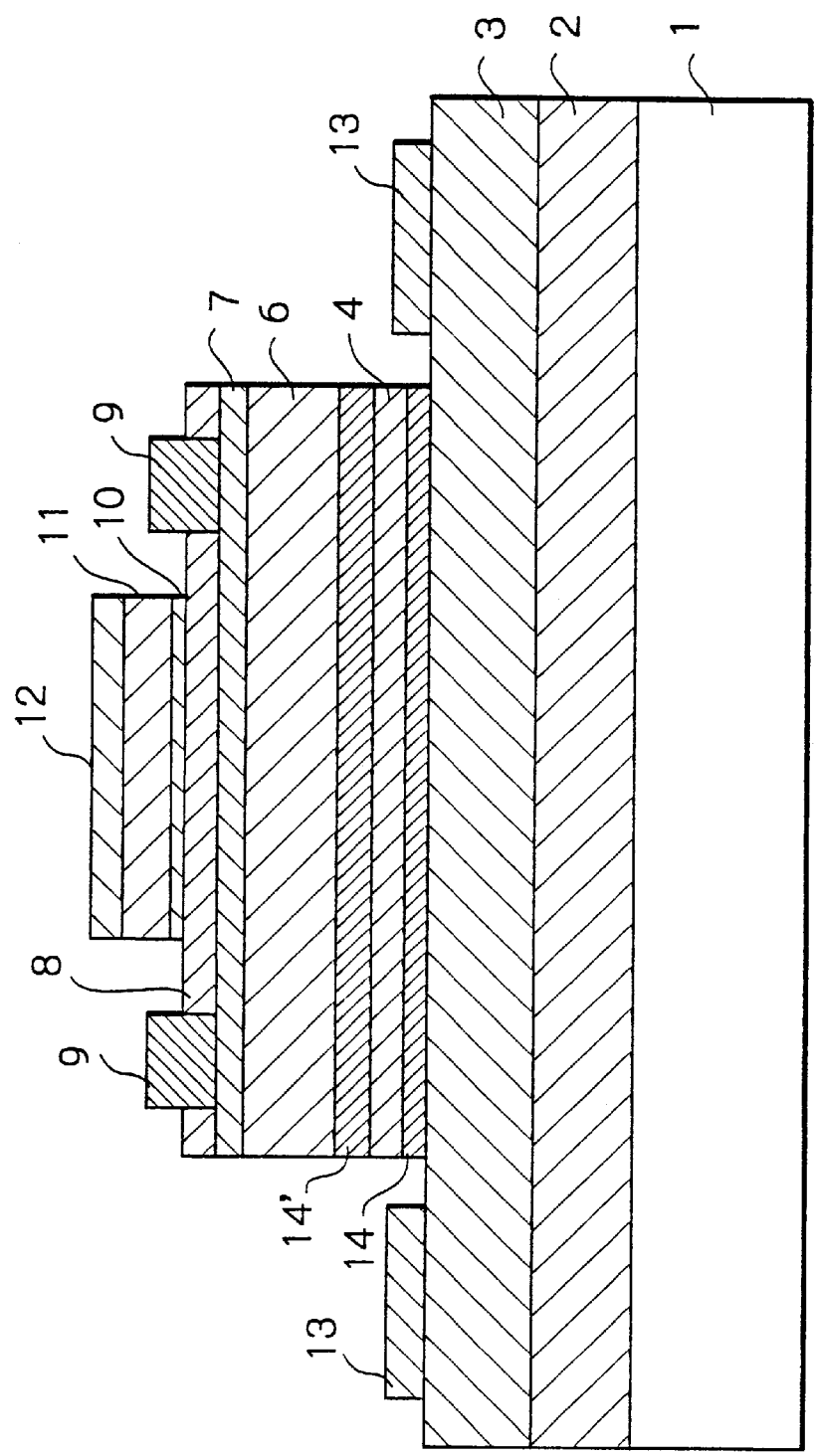

Subsequently, as shown in FIG. 9, the n+ type InGaP layer 14', n type InGaP layer 4 and n+ type InGaP layer 14 are etched vertically downward by use of hydrochloric acid or diluted hydrochloric acid, thereby exposing part of the n+ type GaAs layer 3. The collector electrodes 13 are formed on the exposed portions of the collector contact layer 3. The collector electrodes 13 are again subjected to 400° C. alloying for implementing ohmic contact.

The illustrative embodiment, like the previous embodiment, can effect selective etching and therefore achieves the same advantages as the previous embodiment.

Figure 10:
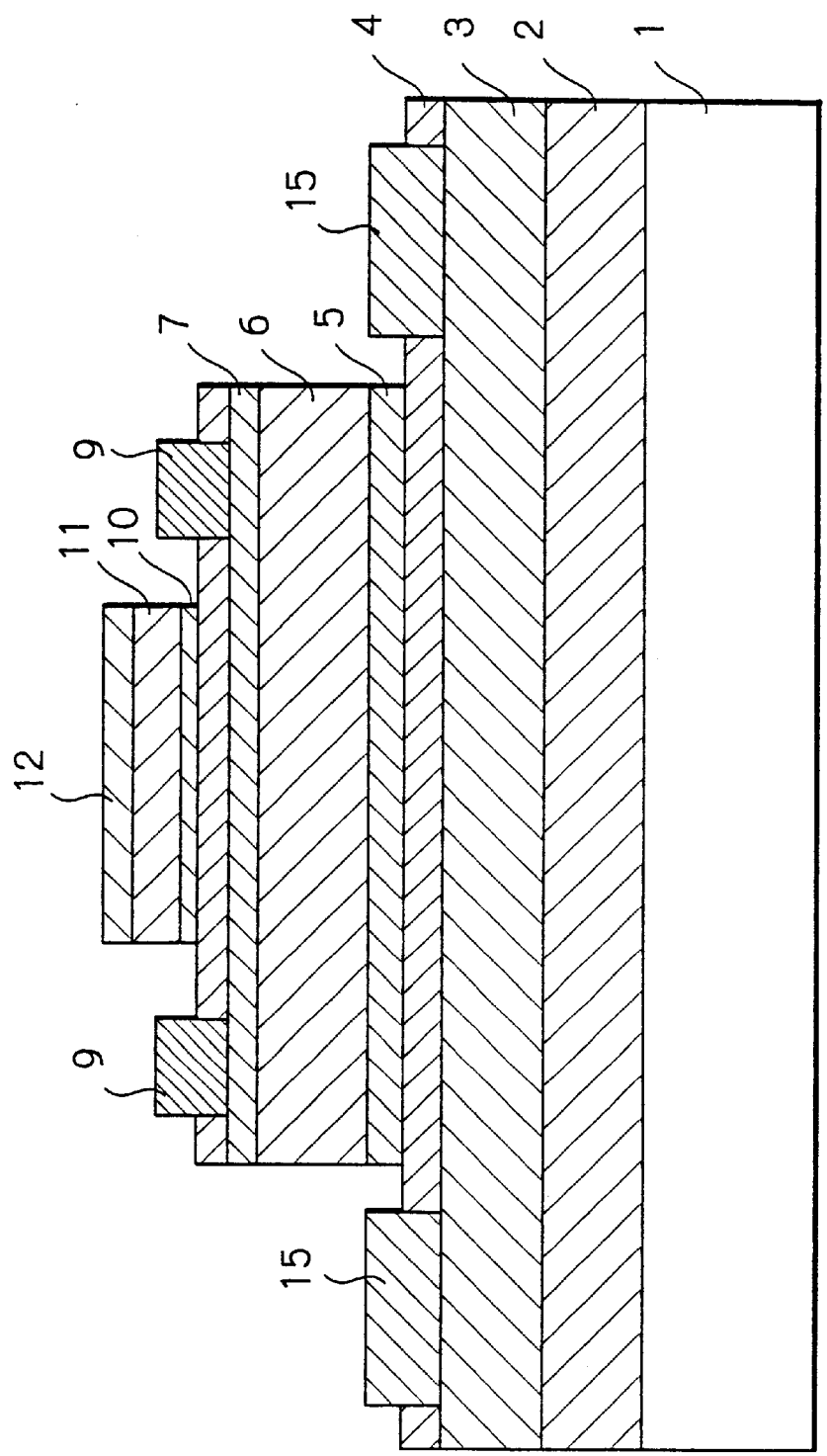
FIG. 10 is a section showing another alternative embodiment of the present invention.

FIG. 10 shows another alternative embodiment of the present invention. This embodiment is identical with the embodiment shown in FIG. 2 except that collector electrodes 15 are substituted for the collector electrodes 13. As shown, the collector electrodes 15 are positioned at the exposed portions of the n type InGaP layer 4 and electrically connected to the n+ type GaAs layer or collector contact layer 3.

Figure 11:
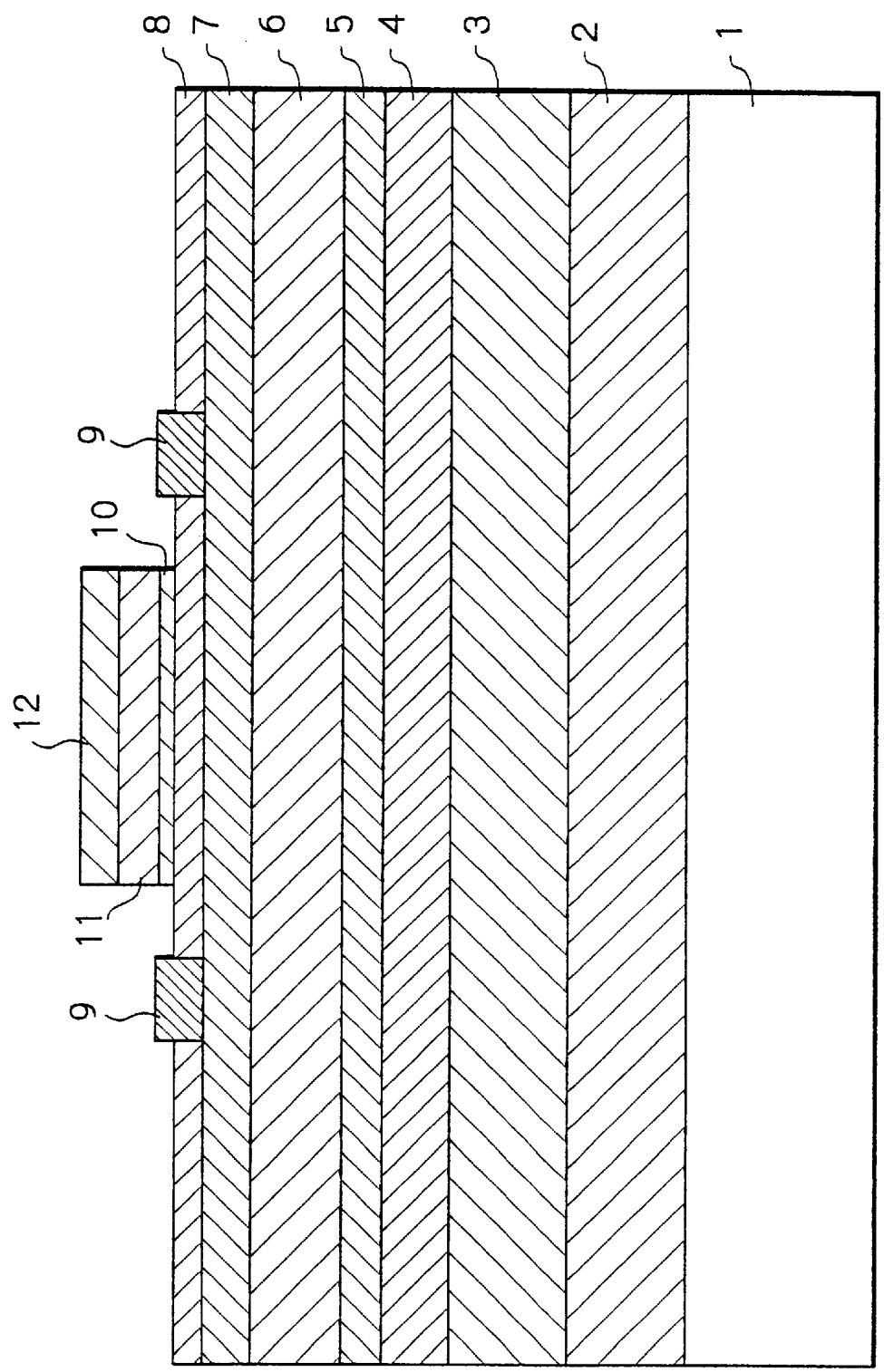
FIGS. 11 through 13 are sections showing a specific procedure for producing the semiconductor device of FIG. 10.
Figure 12:
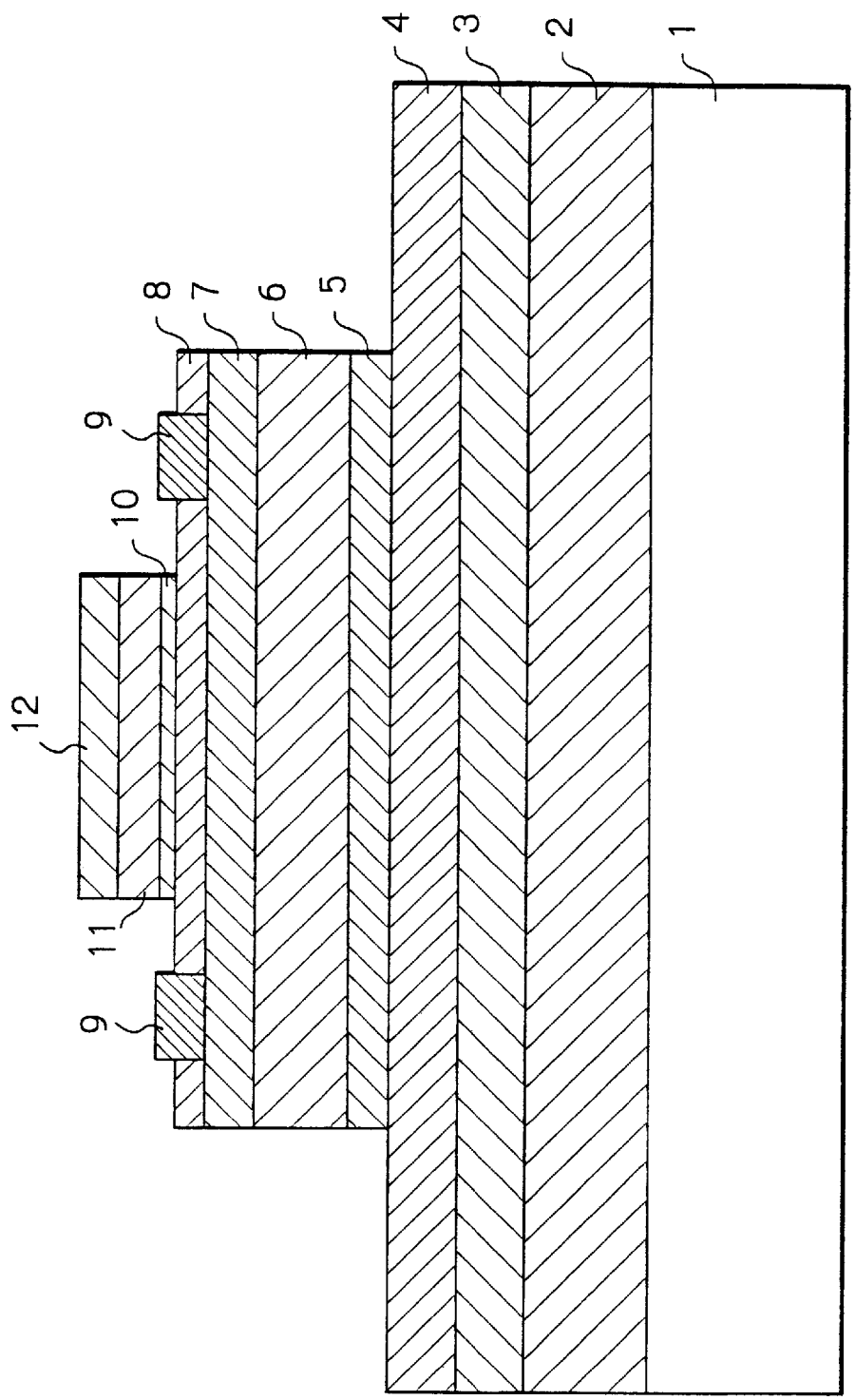

A procedure for producing the semiconductor device shown in FIG. 10 will be described with reference to FIGS. 11 through 13. 6 Again, the following description will concentrate on differences between the procedure of this embodiment and the procedure described with reference to FIGS. 3 through 5. The sequence of steps shown in FIGS. 11 and 12 are identical with the sequence of steps shown in FIGS. 3 and 4 and will not be described specifically in order to avoid redundancy.

Figure 13:
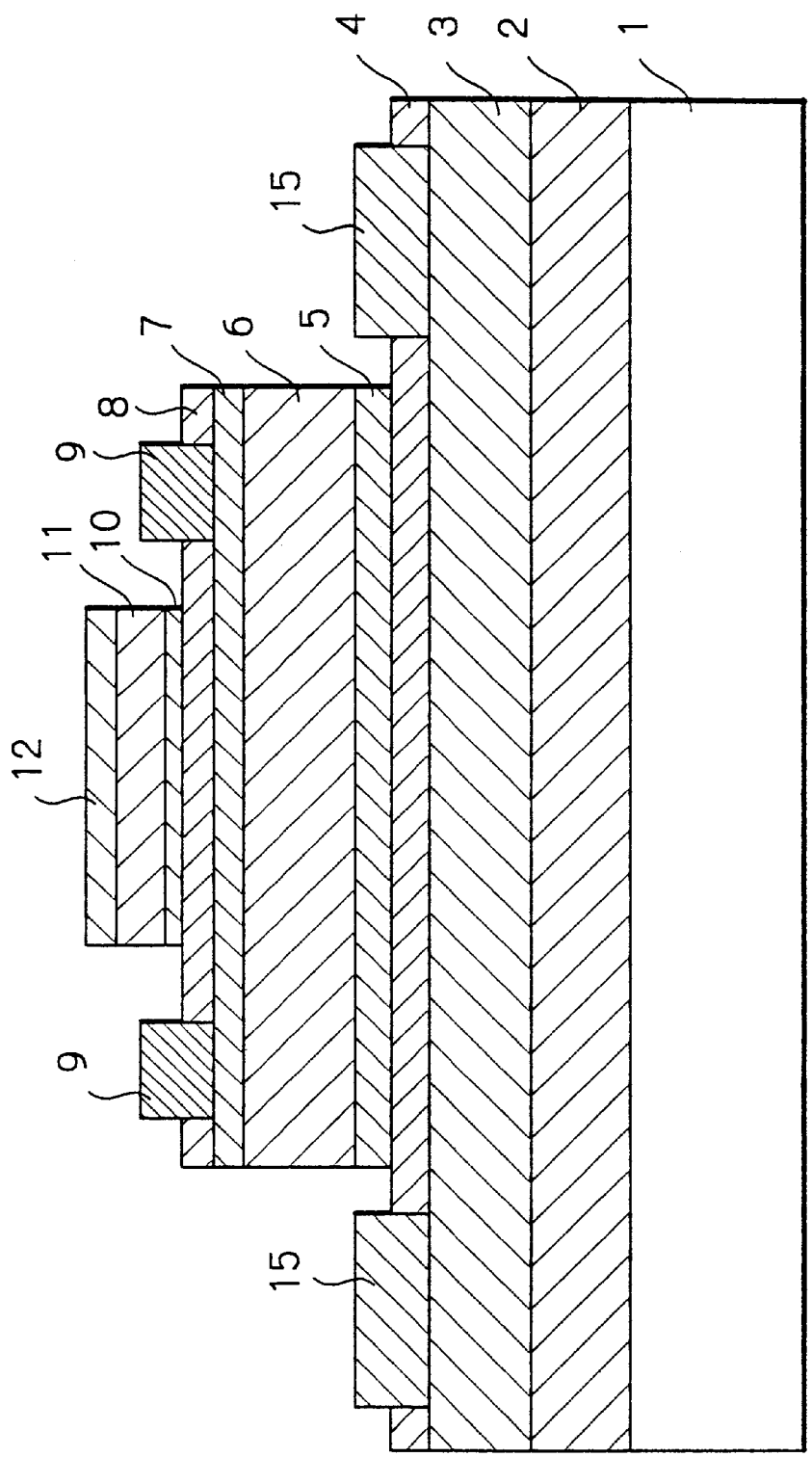

As shown in FIG. 13, the collector electrodes 15 are formed on the n type InGaP layer 4 having the systematic In and Ga structure. More specifically, to implement the ohmic contact of the collector, the collector electrodes 15 are formed by sintering to the surface of the n+ GaAs layer or collector contact layer 3.

The illustrative embodiment, like the previous embodiments, can effect selective etching and therefore achieves the same advantages as the previous embodiments.

Various modifications will become possible for those skilled in the art after receiving the teachings of the present disclosure without departing from the scope thereof.

What is claimed is:

1. A semiconductor device comprising:
 a systematic structure layer of a first conductivity type formed on a collector contact layer of said first conductivity type, which is connected to collector electrodes, and having a systematically arranged structure;
 a compensation layer of the first conductivity type formed on said systematic structure layer, and having a carrier concentration higher than said systematic structure layer;
 a collector layer of the first conductivity type formed on said compensation layer;
 a base layer formed on said collector layer and connected to base electrodes; and
 an emitter layer formed on said base layer and connected to an emitter electrode.

2. The device as claimed in claim 1, wherein said compensation layer comprises a carrier concentration of $3 \times 10^{18}$ cm$^{-3}$ or above.

3. The device as claimed in claim 2, wherein said compensation layer has a thickness of 10 nm or below.

4. The device as claimed in claim 3, wherein said systematic structure layer comprises an InGaP layer.

5. The device as claimed in claim 4, wherein said systematic structure layer comprises $In_xGa_{1-x}P$, where x lies in a range of $0.47 \leq x \leq 0.52$.

6. The device as claimed in claim 5, wherein said systematic structure layer has a band gap of 1.83 eV to 1.88 eV.

7. The device as claimed in claim 2, wherein said systematic structure layer comprises an InGaP layer.

8. The device as claimed in claim 7, wherein said systematic structure layer comprises $In_xGa_{1-x}P$, where then x lies in a range of $0.47 \leq x \leq 0.52$.

9. The device as claimed in claim 8, wherein said systematic structure layer has a band gap of 1.83 eV to 1.88 eV.

10. The device as claimed in claim 1, wherein said collector electrodes are connected to said systematic structure layer as well as to said collector contact layer.

11. The device as claimed in claim 10, wherein said systematic structure layer comprises an InGaP layer.

12. The device as claimed in claim 11, wherein that said systematic structure layer comprises $In_xGa_{1-x}P$, where x lies in a range of $0.47 \leq x \leq 0.52$.

13. The device as claimed in claim 12, wherein said systematic structure layer has a band gap of 1.83 eV to 1.88 eV.

14. The device as claimed in claim 1, wherein said systematic structure layer comprises an InGaP layer.

15. The device as claimed in claim 14, wherein said systematic structure layer comprises $In_xGa_{1-x}P$, where x lies in a range of $0.47 \leq x \leq 0.52$.

16. The device as claimed in claim 15, wherein said systematic structure layer has a band gap of 1.83 eV to 1.88 eV.

17. The semiconductor device of claim 1, wherein said composition layer does not have any composition gradation.

18. A semiconductor device comprising:
 compensation layers of a first conductivity type formed on a collector contact layer of said first conductivity type, which is connected to collector electrodes;
 a systematic structure layer of the first conductivity type formed between said compensation layers and having a systematically arranged structure, wherein said compensation layers have a carrier concentration higher than said systematic structure layer;
 a collector layer of the first conductivity type formed on said compensation layers;
 a base layer formed on said collector layer and connected to base electrodes; and
 an emitter layer formed on said base electrode and connected to an emitter electrode.

19. The device as claimed in claim 18, wherein said compensation layers have a thickness of 10 nm or below.

20. The device as claimed in claim 19, wherein said systematic structure layer comprises an InGaP layer.

21. The device as claimed in claim 20, wherein said systematic structure layer comprises $In_xGa_{1-x}P$, where x lies in a range of $0.47 \leq x \leq 0.52$.

22. The device as claimed in claim 21, wherein said systematic structure layer has a band gap of 1.83 eV to 1.88 eV.

23. The device as claimed in claim 18, wherein said compensation layers comprise a carrier concentration of $2 \times 10^{18}$ cm$^{-3}$ or above.

24. The device as claimed in claim 23, wherein said systematic structure layer comprises an InGaP layer.

25. The device as claimed in claim 24, wherein said systematic structure layer comprises $In_xGa_{1-x}P$, where x lies in a range of $0.47 \leq x \leq 0.52$.

26. The device as claimed in claim 25, wherein said systematic structure layer has a band gap of 1.83 eV to 1.88 eV.

27. The device as claimed in claim 18, wherein said collector electrodes are connected to said systematic structure layer as well as to said collector contact layer.

28. The device as claimed in claim 27, wherein said systematic structure layer comprises an InGaP layer.

29. The device as claimed in claim 28, wherein said systematic structure layer comprises $In_xGa_{1-x}P$, where x lies in a range of $0.47 \leq x \leq 0.52$.

30. The device as claimed in claim 29, wherein said systematic structure layer has a band gap of 1.83 eV to 1.88 eV.

31. The device as claimed in claim 18, wherein said systematic structure layer comprises an InGaP layer.

32. The device as claimed in claim 31, wherein said systematic structure layer comprises $In_xGa_{1-x}P$, where x lies in a range of $0.47 \leq x \leq 0.52$.

33. The device as claimed in claim 32, wherein said systematic structure layer has a band gap of 1.83 eV to 1.88 eV.

* * * * *